US012633319B2

(12) United States Patent
Yang et al.

(10) Patent No.: US 12,633,319 B2
(45) Date of Patent: May 19, 2026

(54) APPARATUS INCLUDING MULTIPLE HIGH BANDWIDTH MEMORY CUBES

(71) Applicant: Micron Technology, Inc., Boise, ID (US)

(72) Inventors: Lingming Yang, Meridian, ID (US); Raghukiran Sreeramaneni, Frisco, TX (US); Nevil N. Gajera, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 110 days.

(21) Appl. No.: 18/642,796

(22) Filed: Apr. 22, 2024

(65) Prior Publication Data

US 2024/0371410 A1 Nov. 7, 2024

Related U.S. Application Data

(60) Provisional application No. 63/463,536, filed on May 2, 2023.

(51) Int. Cl.
| | |
|---|---|
| *G11C 5/02* | (2006.01) |
| *H10B 80/00* | (2023.01) |
| *H10W 90/00* | (2026.01) |
| *H10W 90/20* | (2026.01) |

(52) U.S. Cl.
CPC .............. *G11C 5/02* (2013.01); *H10B 80/00* (2023.02); *H10W 90/00* (2026.01); *H10W 90/297* (2026.01)

(58) Field of Classification Search
CPC ....... G11C 5/02; H01L 25/0652; H01L 25/18; H01L 2225/06541; H10B 80/00

USPC ................................................ 365/51, 230.06
See application file for complete search history.

(56) References Cited

U.S. PATENT DOCUMENTS

| | | | |
|---|---|---|---|
| 2018/0012867 A1* | 1/2018 | Kim ......................... H01L 25/18 |
| 2018/0046908 A1 | 2/2018 | Cox et al. | |
| 2018/0358960 A1* | 12/2018 | Kim .................... H03K 19/0016 |
| 2019/0044764 A1* | 2/2019 | Hollis .................. G11C 7/1048 |
| 2019/0050325 A1 | 2/2019 | Malladi et al. | |
| 2019/0220566 A1* | 7/2019 | Tang ....................... G06F 13/20 |
| 2020/0097417 A1 | 3/2020 | Malladi et al. | |
| 2021/0157751 A1* | 5/2021 | Kwon ................... G11C 7/109 |
| 2021/0343325 A1* | 11/2021 | Moon ................. G11C 11/4076 |
| 2022/0028848 A1* | 1/2022 | Baek ................... H01L 25/0652 |
| 2022/0139426 A1* | 5/2022 | Keeth ................... G11C 5/063 |
| | | | 365/244 |

(Continued)

FOREIGN PATENT DOCUMENTS

WO 2018052546 A1 3/2018

OTHER PUBLICATIONS

International Application No. PCT/US2024/025952—International Search Report and Written Opinion, mailed Aug. 12, 2024, 11 pages.

*Primary Examiner* — Michael T Tran
(74) *Attorney, Agent, or Firm* — Dorsey & Whitney LLP

(57) ABSTRACT

An apparatus including a high bandwidth memory circuit and associated systems and methods are disclosed herein. The apparatus may include multiple HBM cubes connected to a processor, such as a GPU. The HBM cubes may be connected in series or in parallel. One or more of the HBM cubes can include a secondary communication circuit configured to facilitate the expanded connection between the multiple cubes.

20 Claims, 9 Drawing Sheets

(56) References Cited

U.S. PATENT DOCUMENTS

2022/0254390 A1    8/2022  Gans et al.
2023/0253294 A1*  8/2023  Lee ..................... G06F 13/4022
                                  257/690

* cited by examiner

600

RECEIVE CUBE ASSIGNMENT 602

RECEIVE COMMAND AT PRIMARY CUBE 604

IDENTIFY ADDRESS OF THE COMMAND 606

Local? 607

YES

NO

ACCESS LOCAL DIE/LOCATION 614

BUFFER THE COMMAND 608

TRANSFER TO DOWNSTRM CUBE 610

RCV FROM DOWNSTRM CUBE 612

PROVIDE COMMUNICATION 616

RECEIVE CUBE ASSIGNMENT 651

RECEIVE FIRST COMMAND FOR PRIMARY CUBE 652

RECEIVE SECOND COMMAND FOR SECONDARY CUBE 654

IDENTIFY ADDRESS OF THE FIRST AND SECOND COMMANDS 656

BUFFER THE SECOND COMMAND 658

TRANSFER SECOND COMMAND TO SECONDARY CUBE 660

EXECUTE FIRST COMMAND AT PRIMARY CUBE 662

APPARATUS INCLUDING MULTIPLE HIGH BANDWIDTH MEMORY CUBES

CROSS-REFERENCE TO RELATED APPLICATION(S)

The present application claims priority to U.S. Provisional Patent Application No. 63/463,536, filed May 2, 2023, the disclosure of which is incorporated herein by reference in its entirety.

TECHNICAL FIELD

The present technology is directed to apparatuses, such as semiconductor devices including memory and processors, and several embodiments are directed to semiconductor devices that include multiple high bandwidth memory cubes.

BACKGROUND

An apparatus (e.g., a processor, a memory device, a memory system, or a combination thereof) can include one or more semiconductor circuits configured to store and/or process information. For example, the apparatus can include a memory device, such as a volatile memory device, a non-volatile memory device, or a combination device. Memory devices, such as dynamic random-access memory (DRAM) and/or high bandwidth memory (HBM), can utilize electrical energy to store and access data.

With technological advancements in embedded systems and increasing applications, the market is continuously looking for faster, more efficient, and smaller devices. To meet the market demands, the semiconductor devices are being pushed to the limit with various improvements. Improving devices, generally, may include increasing circuit density, increasing circuit capacity, increasing operating speeds or otherwise reducing operational latency, increasing reliability, increasing data retention, reducing power consumption, or reducing manufacturing costs, among other metrics. However, attempts to meet the market demands, such as by reducing the overall device footprint, can often introduce challenges in other aspects, such as for maintaining circuit robustness and/or failure detectability.

DETAILED DESCRIPTION

Figure 1:
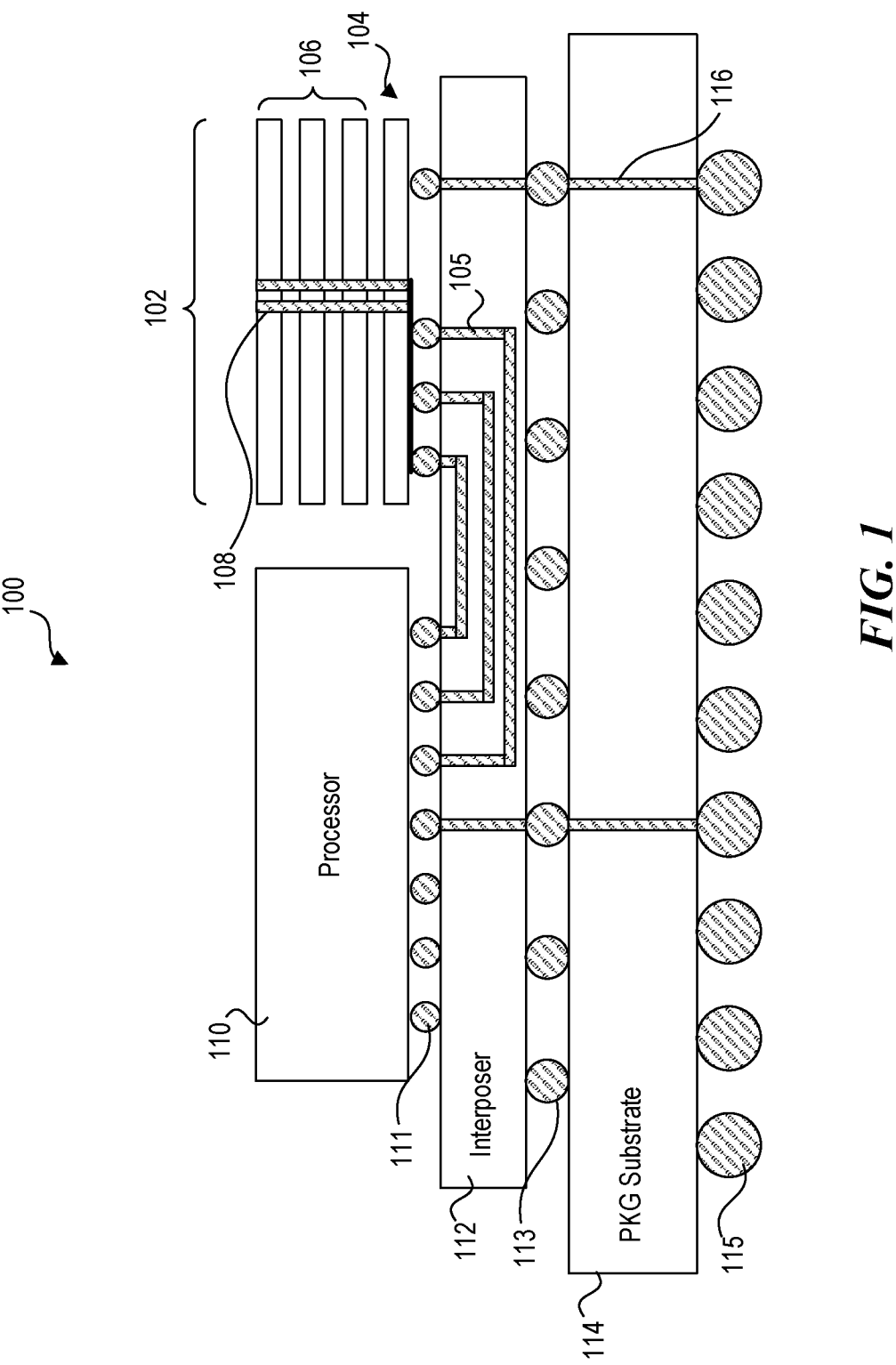
FIG. 1 is a cross-sectional view of a system-in-package device in accordance with embodiments of the technology.

As described in greater detail below, the technology disclosed herein relates to an apparatus, such as for memory systems, systems with memory devices, related methods, etc., for implementing connecting multiple high bandwidth memory cubes to a processing unit. In some embodiments, an apparatus (e.g., a memory device, such as a high bandwidth memory (HBM) and/or a RAM, and/or a corresponding system) can include a graphics processing unit (GPU) connected to a HBM stack (e.g., memory cube) via an interposer.

As demands for storage capacity and related bandwidths increase for the GPU, it can become difficult to expand the HBM stack capacity as well as the bandwidth for the HBM stack. To meet the bandwidth demands, the size and/or density of the stack can be increased. However, any resulting increases in the dimensions of a HBM stack can result in higher thermal footprint values that negatively affect performance. For example, methods such as DRAM cell scaling, increasing core die stack number, or increasing core die size are generally not a feasible solution due to cost, power, thermal, or speed concern.

In contrast, embodiments of the present technology can include mechanisms for connecting two or more HBM cubes to a GPU to increase the memory capacity. In some embodiments, the GPU can be coupled to two or more serially connected HBM cubes through a single IO bus. The GPU can communicate with and through the primary cube. The primary cube can communicate with downstream satellite cube(s). For example, the GPU sends a command through an IO bus to the primary cube, and the primary cube determines the address of the command. If the address of the command indicates a storage location in the primary cube (e.g., a corresponding local address range), the primary cube can store/retrieve the data at the address. If the address of the command indicates a location in a satellite cube (e.g., outside of the local address range), the primary cube can transfer the command to the satellite cube. Serially connecting HBM cubes increases the capacity accessible to the GPU without altering the physical dimensions of the HBM cubes.

For the serial connection, each HBM cube can include (1) a physical layer circuit (e.g., transceiver) that interfaces with an upstream device, and (2) a secondary communication circuit (e.g., a buffer, a separate transceiver, or the like) configured to interface with a downstream device. For example, the primary cube can have its physical layer circuit coupled to the GPU and its secondary communication circuit coupled to a physical layer circuit of the satellite cube. The physical layer circuit and/or a logic circuit at the primary cube can compare the address of an incoming command to the predetermined local range. When the address is within the range, the command can be locally executed to access a local storage location. When the address is outside of the range, the primary cube can use the secondary communication circuit to (1) send the command downstream, (2) receive a response to the sent command from downstream, or both. The physical layer circuit, the logic circuit, the secondary communication circuit, or a combination thereof at each of the satellite cubes can be configured to perform the same operation for a unique range of local addresses.

Additionally or alternatively, to increase capacity and bandwidth, two or more HBM cubes can be connected in parallel to the GPU via several IO buses. Two or more HBM cubes can be operated in parallel using a dedicated IO bus for each HBM cube to independently communicate commands and information/data with the GPU. For example, a primary cube has two or more physical layer circuits. A first physical layer circuit can be configured to receive commands from the GPU via a first IO bus and a second physical layer circuit can be configured to receive commands from the GPU via a second IO bus. The commands received by the second physical layer circuit can be intended for a secondary cube, and the second physical layer circuit can re-transmit the received command to the secondary cube. Using the independent first and second physical layer circuits, the GPU can communicate with both parallel-connected HBM cubes. The secondary cube can operate in parallel (e.g., independently, simultaneously, and more) with the primary cube, thereby increasing the memory capacity accessible to the GPU while the parallel connection increases the GPU bandwidth.

Embodiments of the present technology can provide technical advantages over conventional technology, such as: 1) designing an interposer in a flexible way that one or more HBM cubes are connected to one set of IO buses, and 2) increasing the capacity and/or bandwidth accessible to the GPU without increasing the single cube DRAM die size, stack height, thermal footprint, etc., by connecting two or more satellite cubes to the primary cube. The present technology can be detected in several ways, for example, datasheet review, public information, testing, circuit extraction, or photolithography.

Example Environment

FIG. 1 illustrates a schematic cross-sectional view of a system-in-package (SiP) device 100 (i.e., an example apparatus) in accordance with embodiments of the technology. The SiP 100 can include a set of memory devices 102 and the processor 110 (e.g., GPU), which are packaged together on a package substrate 114 along with an interposer 112. The processor 110 may act as a host device of the SiP 100. For illustrative purposes, FIG. 1 shows one chip stack for the memory devices 102. However, as described below, the memory devices 102 can include multiple separate chip stacks that are connected in parallel and/or serial arrangements.

In some embodiments, each memory device 102 may be an HBM device that includes an interface die (or logic die) 104 and one or more memory core dies 106 stacked on the interface die 104. The memory device 102 can include one or more through silicon vias (TSVs) 108, which may be used to couple the interface die 104 and the core dies 106. The interface die 104 can be configured to control communications between the processor 110 and the local core dies 106. The interface die 104 may have local storage capacity. The core dies 106 can each include storage arrays, such as for volatile and/or non-volatile memory. Some examples of core dies 106 can include Dynamic Random-Access Memories (DRAMs), NAND-based Flash memories, combination memories, and the like.

The interposer 112 can provide electrical connections between the processor 110, the memory device 102, and/or the package substrate 114. For example, the processor 110 and the memory device 102 may both be coupled to the interposer 112 by a number of internal connectors (e.g., micro-bumps 111). The interposer 112 may include channels 105 (e.g., an interfacing or a connecting circuit, input/output (IO) circuit) that electrically couple the processor 110 and the memory device 102 through the corresponding micro-bumps 111. In some embodiments, the channels 105 can be coupled to (1) native bumps or connections for directly communicating with the processor 110 and (2) P1500 bumps configured to support standardized communication protocol. Although only three channels 105 are shown in FIG. 1, greater or fewer numbers of channels 105 may be used. The interposer 112 may be coupled to the package substrate by one or more additional connections (e.g., intermediate bumps 113, such as C4 bumps).

The package substrate 114 can provide an external interface for the SiP 100. The package substrate 114 can include external bumps 115, some of which may be coupled to the processor 110, the memory device 102, or both. The package substrate may further include direct access (DA) bumps coupled through the package substrate 114 and interposer 112 to the interface die 104. In some embodiments, the direct access bumps 116 (e.g., one or more of the bumps 115) and/or other bumps may be organized into a probe pad (e.g., a set of test connectors). As bandwidth demands increase from the GPU system, it is more difficult to expand the HBM stack capacity as well as bandwidth for a given stack. The bandwidth can be increased by increasing the size or density of the HBM stack. For example, cell scaling, increasing core die stack number, or increasing core die size of memory core die 106. However, to increase the bandwidth, requires an increase in the I/O circuit and an increase in TSVs in the memory device 102.

Example Circuitry

Figure 2:
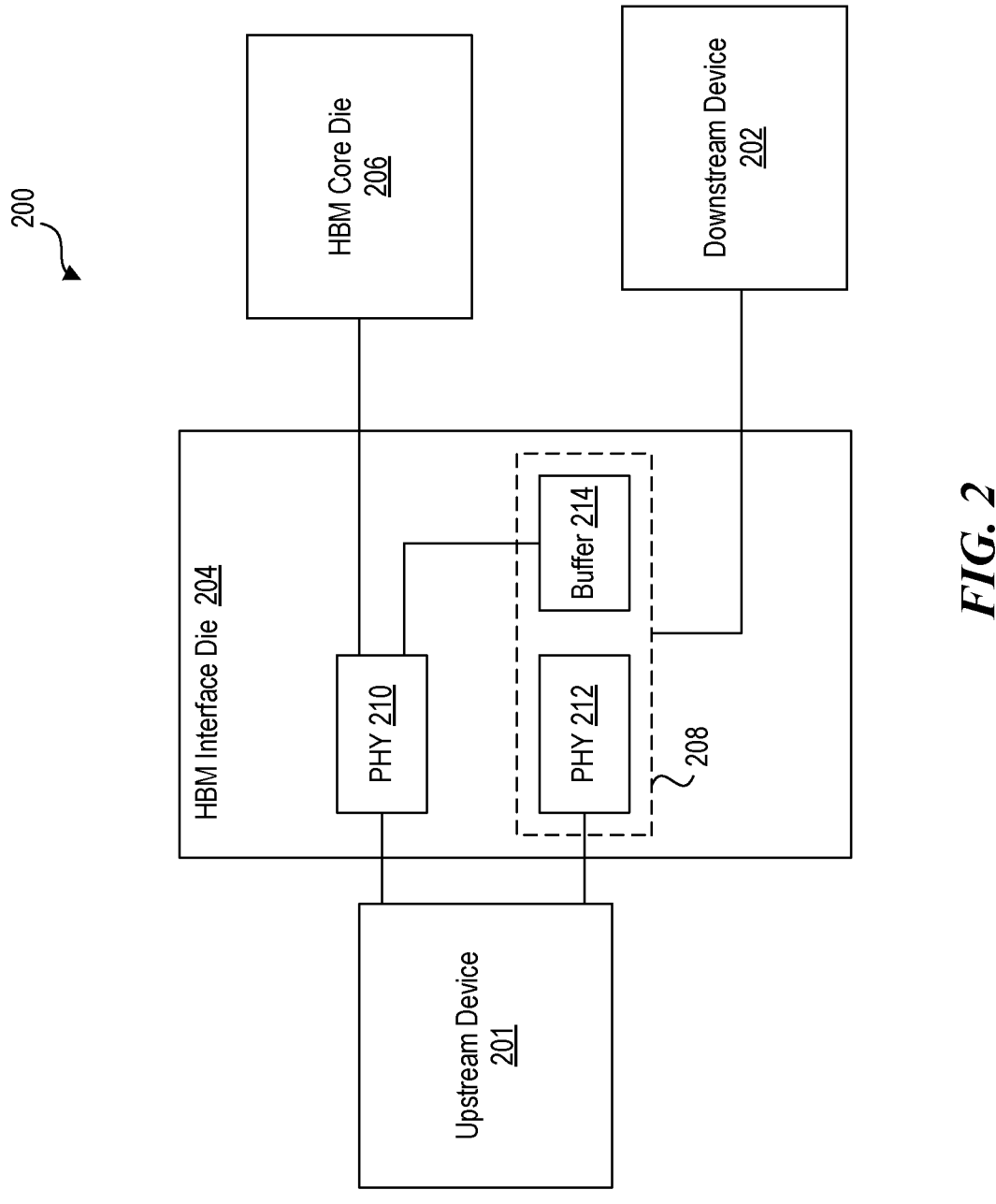
FIG. 2 is a block diagram of a memory device in accordance with embodiments of the technology.

FIG. 2 is a block diagram of a memory device 200 (i.e., an example apparatus, such as the memory device 102 of FIG. 1 or a portion thereof) in accordance with embodiments of the technology. The memory device 200 may include an interface die 204 and one or more core dies 206. For clarity, only a single core die 206 is shown in FIG. 2, however it should be understood that multiple core dies 206 may be coupled to the interface die 204 (e.g., there may be 2, 3, 4, 7, 8, 16 or other quantities of core dies 206). The interface die 204 can include one or more physical layer circuits (e.g., PHY 210 and PHY 212) and/or a buffer (e.g., buffer 214). In other words, the interface die 204 can include (1) a physical layer circuit (e.g., PHY 210) configured for upstream communications (e.g., with upstream device 201, such as a GPU) and (2) at least one secondary communication circuit (e.g., secondary communication circuit 208 which includes PHY 212 and/or buffer 214) configured for downstream communications (e.g., with downstream device 202, such as an HBM stack). The physical layer circuits of the interface die 204 can send/receive data to/from the processor 110 of FIG. 1. The physical layer circuits of the interface die 204 can receive commands and/or data from the GPU. PHY 212 can be further configured to relay the commands and/or the data to a physical layer of another downstream interface die connected operating in series or in parallel with the interface die 204. The buffer circuit (e.g., buffer 214) can be configured for communication between instances of the interface dies (e.g., across the separate stacks or instances of the HBM).

Figure 3:
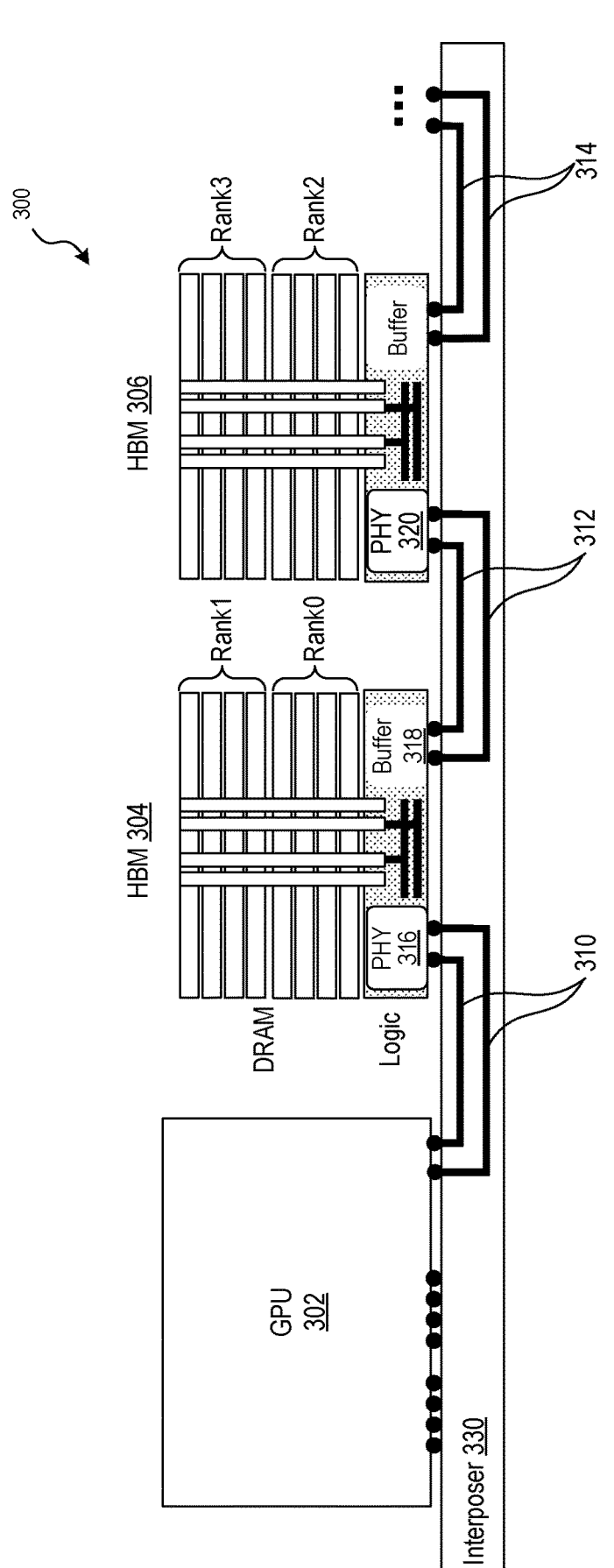
FIG. 3 is a block diagram of a high bandwidth memory system with multiple high bandwidth memory cubes connected in series in accordance with an embodiment of the present technology.

FIG. 3 is a block diagram of a high bandwidth memory system 300 (e.g., a portion of the SiP device 100 of FIG. 1, a portion of the memory device 200 of FIG. 2, or a combination thereof) with multiple high bandwidth memory cubes connected in series in accordance with an embodiment of the present technology. The high bandwidth memory system 300 can correspond to the SiP device 100 or a portion thereof adjusted to include the flexible connection.

To increase capacity and processing, HBM cube 304 can be connected to GPU 302 via an IO bus 310 (e.g., a designated set of native connections) and can be connected to HBM cube 306 via an IO bus 312. The components can be mounted on an interposer 330 (e.g., a silicon interposer, a redistribution structure, or a PCB). In some embodiments, the IO buses 310, 312, and/or 314 can include electrically conductive structures (e.g., vias, traces, planes, etc.) embedded within the interposer 330. The interposer 330 can be similar to or correspond to the interposer 112 of FIG. 1.

The HBM cubes 304 and 306 can be a volatile or high bandwidth memory (such as DRAM) or high density or non-volatile storage (such as NAND) or a combination thereof. Each of the HBM cubes 304 and 306 can include a logic die (with an interconnect physical layer (PHY), buffer, and circuits), a set of core dies (e.g., DRAM dies), and several IO buses so each cube is configurable/trimmable to be used as a primary device or satellite device (e.g., outside of the local address range of the primary device). As an illustrative example, the GPU 302 can communicate with the first HBM cube 304 as a primary device, and the primary HBM cube 304 can communicate with the satellite HBM cube 306 (e.g., a satellite device for the GPU 302) via the IO bus 312 connected to the physical layer circuits of HBM cubes 304 and 306. The GPU 302 can send a command through IO bus 310 to PHY 316 of the primary HBM cube 304. The PHY 316 of the primary HBM cube 304 determines the address of the command. If the address of the command indicates a location within the primary HBM cube 304 (e.g., a storage location in one of the stacked core dies), the primary HBM cube 304 stores/retrieves the data at the local storage location. If the address of the command indicates a location within satellite HBM cube 306 (e.g., when the command address is outside of a predetermined address range for local storage locations), the primary HBM cube 304 can use IO bus 312 to transfer the command from buffer 318 of the primary HBM cube 304 to PHY 320 of the satellite HBM cube 306.

If more neighboring devices (e.g., downstream HBM cubes) (not shown) are connected to HBM cube 306, each of the neighboring devices can have a predetermined address range or a set of channels for its local storage locations. The neighboring devices can compare the incoming command address to the predetermined range and transfer/relay the command to the next downstream device until the command address is found within the local address range. From the perspective of GPU 302, the capacity is increased according to the number of memory or storage cubes connected to HBM cube 304.

Given the expandable configuration, the multiple HBM cubes can be used to implement multiple memory ranks, such as by having each cube include two or more memory ranks (e.g., data blocks). For example, as illustrated, HBM cube 304 includes rank0 and rank1, and HBM cube 306 includes rank 2 and rank3. By serially connecting HBM cube 304 and HBM cube 306, the capacity accessible to the GPU 302 is increased by the additional number of memory ranks of each serially connected cube.

For the sake of brevity and for illustrative purposes, the set of memory cubes are described using a HBM cube 304 and HBM cube 306. However, it is understood that the various embodiments described below can be implemented in other configurations, such as for devices that have a primary HBM cube and two or more satellite HBM cubes.

Figure 4:
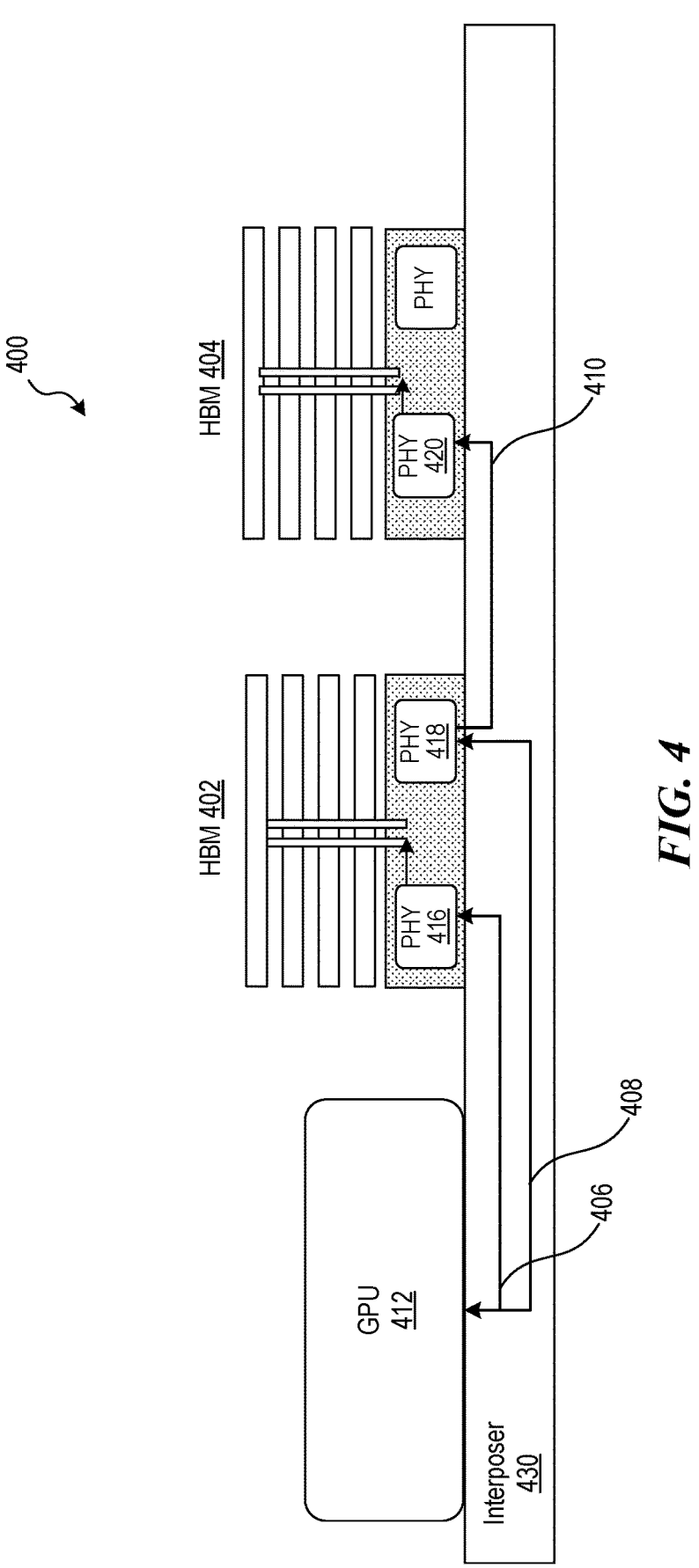
FIG. 4 is a block diagram of a high bandwidth memory system with multiple high bandwidth memory cubes connected in parallel in accordance with an embodiment of the present technology.

FIG. 4 is a block diagram of a high bandwidth memory system 400 (e.g., a portion of the SiP device 100 of FIG. 1, a portion of the memory device 200 of FIG. 2, or a combination thereof) with multiple high bandwidth memory cubes connected in parallel in accordance with an embodiment of the present technology. To increase capacity and bandwidth, two or more HBM cubes can be parallelly connected to a GPU via several IO buses. For example, HBM cube 402 and HBM cube 404 can be connected in parallel with GPU 412. HBM cube 402 has a dedicated IO bus 406 to receive commands from GPU 412. HBM cube 404 has a dedicated IO bus 408 to receive commends from GPU 412. Accordingly, GPU 412 can access or interact with HBM cube 402 and HBM cube 404 independently and/or simultaneously.

The components can be mounted on an interposer 430 (e.g., a silicon interposer, a redistribution structure, or a PCB). In some embodiments, the IO buses 406, 408, and/or 410 can include electrically conductive structures (e.g., vias, traces, planes, etc.) embedded within the interposer 430. The interposer 430 can be similar to or correspond to the interposer 112 of FIG. 1. HBM cube 402 and HBM cube 404 can be a volatile or high bandwidth memory (such as DRAM) or high density or non-volatile storage (such as NAND) or a combination thereof. HBM cube 402 and HBM cube 404 can include a logic die (with an interconnect physical layer (PHY), buffer, and circuits), a set of core dies (e.g., DRAM dies), and several IO buses so each cube is configurable/trimmable to communicate with GPU 412.

GPU 412 can communicate with HBM cube 402 via IO bus 406 (e.g., 2 k IO 16 Gbps). In a first example, GPU 412 sends a command through IO bus 406 to PHY 416 of HBM cube 402. The PHY 416 of HBM cube 402 determines the address of the command. If the address of the command indicates a location within HBM cube 402 (e.g., a storage location in one of the stacked core dies), HBM cube 402 stores/retrieves the data at the local storage location.

GPU 412 can communicate with HBM cube 404 via IO bus 408 (e.g., 2 k IO 16 Gbps). In a second example, if the address of the command indicates a location within HBM cube 404, GPU 412 sends a command through IO bus 408 to PHY 418 of HBM cube 402. PHY 418 of HBM cube 402 can buffer the command and transfer the command through IO bus 410 (e.g., 2 k IO 16 Gbps) to PHY 420 of HBM cube 404. The parallel connection can effectively use the PHY 418 of HBM cube 402 as a repeater in accessing HBM cube 404, thereby accounting for the physical distance between GPU 412 and HBM cube 404 and preserving the signal integrity across the physical distance. If more cubes (not shown) are parallelly connected, HBM cube 402 can transfer the command to the HBM cube with the designated address.

HBM cube 402 and HBM cube 404 can parallelly operate with GPU 412, because each HBM cube has a designated IO bus to receive commands from GPU 412. Multiple HBM cubes parallelly operating, increases (e.g., doubles if 2 cubes are connected, quadruples if 4 cubes are connected, etc.) the capacity and bandwidth accessible to the GPU.

For the sake of brevity and for illustrative purposes, the set of memory cubes are described using a HBM cube 402 and HBM cube 404. However, it is understood that the various embodiments described below can be implemented in other configurations, such as for devices that have multiple HBM cubes connected in parallel.

Figure 5:
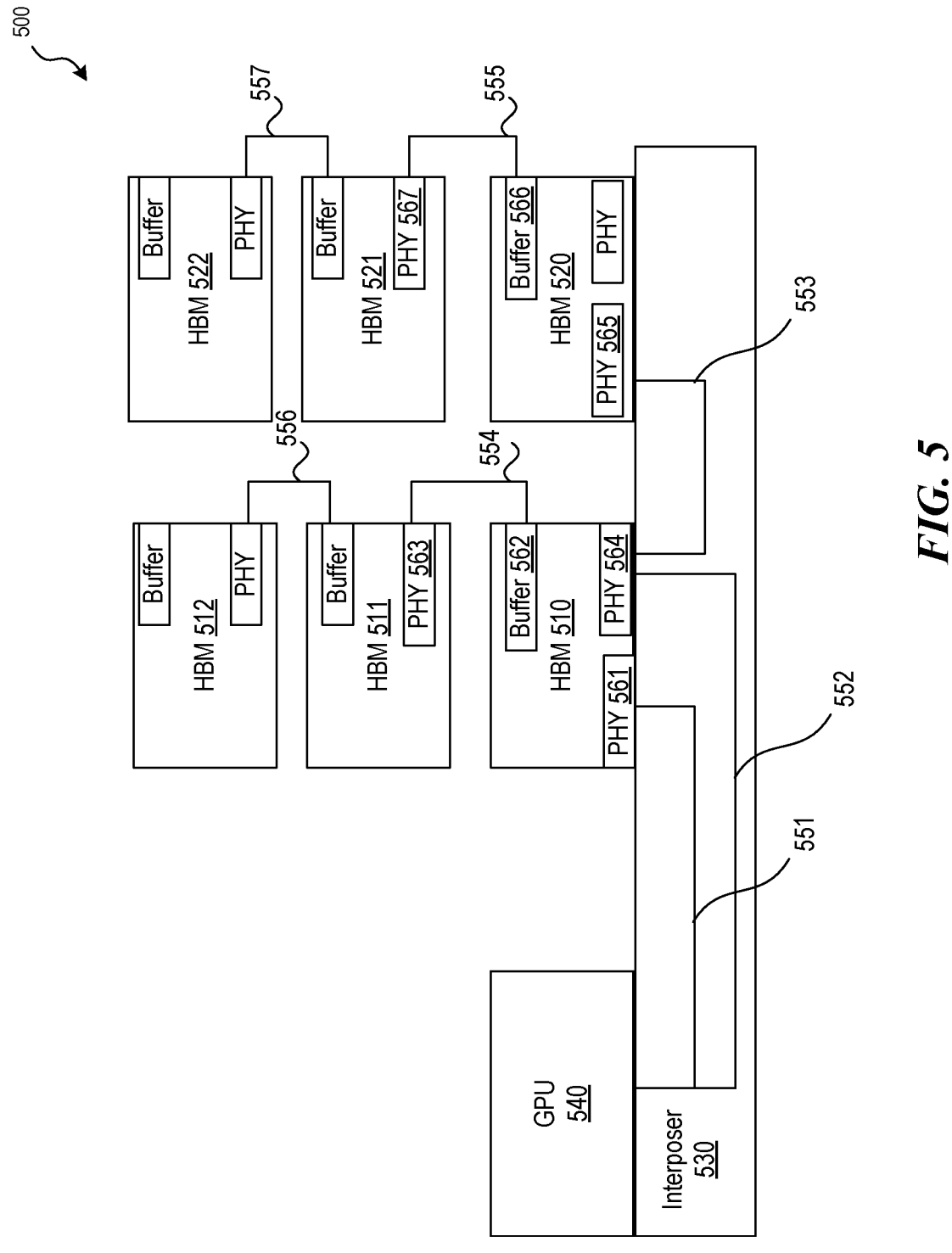
FIG. 5 is a block diagram of a high bandwidth memory system with multiple high bandwidth memory cubes connected in both parallel and serial arrangements in accordance with an embodiment of the present technology.

FIG. 5 is a block diagram of a high bandwidth memory system 500 (e.g., a portion of the SiP device 100 of FIG. 1, a portion of the memory device 200 of FIG. 2, or a combination thereof) with multiple high bandwidth memory cubes connected in both parallel and serial arrangements, in accordance with an embodiment of the present technology. For the combined arrangement, each of the HBM cubes can include a secondary communication circuit that is configured to manage both the serial communication (via, e.g., a buffer) and the parallel communication (via, e.g., a secondary physical layer (PHY) circuit).

For the example, illustrated in FIG. 5, HBM cube 510 and HBM cube 520 are connected in parallel to GPU 540. HBM cube 511 and HBM cube 512 are serially connected to HBM cube 510. HBM cube 521 and HBM cube 522 are serially connected to HBM cube 520. GPU 540 communicates with HBM cube 510 or HBM cube 520 (e.g., via PHY 2 of HBM cube 510). HBM cube 510 communicates with HBM cube 520 and/or HBM cube 511. The components can be mounted on an interposer 530 (e.g., a silicon interposer, a redistribution structure, or a PCB). In some embodiments, the IO buses 551, 552, 553, 554, 555, 556, and/or 557 can include electrically conductive structures (e.g., vias, traces, planes, etc.) embedded within the interposer 530. The interposer 530 can be similar to or correspond to the interposer 112 of FIG. 1. HBM cubes 510, 511, 512, 520, 521, and 522 can be a volatile or high bandwidth memory (such as DRAM) or high density or non-volatile storage (such as NAND) or a combination thereof. HBM cubes 510, 511, 512, 520, 521, and 522 can include a logic die (with an interconnect physical layer (PHY), buffer, and circuits), a set of core dies (e.g., DRAM dies), and several IO buses so each cube is configurable/trimmable to communicate with GPU 540.

The serial and parallel communications can be similar to various aspects described above. In a first example, GPU 540 sends a command through IO bus 551 to PHY 561 of HBM cube 510. The PHY 561 of HBM cube 510 determines the address of the command. If the address of the command indicates a location within HBM cube 511, HBM cube 510 buffers (e.g., due to the distance from GPU 540 to the receiver (PHY 563) of HBM cube 511) the command and transfers the command to the serially connected HBM cube 511. HBM cube 510 can use IO bus 554 to transfer the command from buffer 562 of the HBM cube 510 to PHY 563 of the HBM cube 511.

GPU 540 can communicate with HBM cube 520 via IO bus 552. In a second example, GPU 540 sends a command through IO bus 552 to PHY 564 of HBM cube 510. If the address of the command indicates a location within HBM cube 521, PHY 564 of HBM cube 510 can buffer the command and transfer the command through IO bus 553 to PHY 565 of HBM cube 520. HBM cube 520 buffers (e.g., due to the distance from GPU 540 to the receiver (PHY 567) of HBM cube 521) the command and transfers the command to the serially connected HBM cube 521. HBM cube 520 can use IO bus 555 to transfer the command from buffer 566 of the HBM cube 520 to PHY 567 of HBM cube 521.

Multiple cubes parallelly and serially operating, increases the capacity and bandwidth accessible to the GPU. At each cube, a primary PHY and/or the local logic circuit can determine whether to access a local storage location in one of the stacked core dies or to relay the command downstream through the buffer. A secondary PHY can be configured to function as a bridge or a repeater and automatically relay the received command to implement a remaining portion of the parallel connection.

Figure 6A:
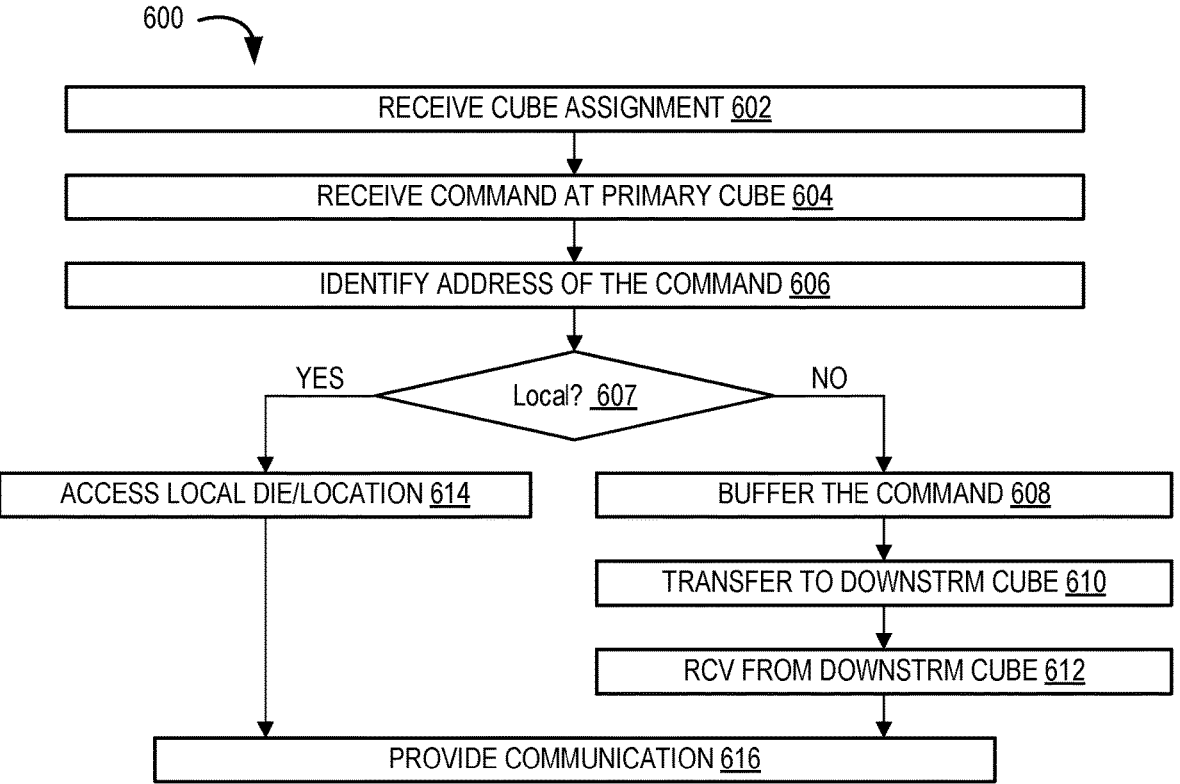
FIG. 6A is a flow diagram illustrating an example method of operating an apparatus in accordance with an embodiment of the present technology.

FIG. 6A is a flow diagram illustrating an example method 600 of operating an apparatus (e.g., the apparatus 100 of FIG. 1, memory device 200 of FIG. 2, high bandwidth memory system 300 of FIG. 3, high bandwidth memory system 400 of FIG. 4, high bandwidth memory system 500 of FIG. 5, or a portion thereof) in accordance with an embodiment of the present technology. The method 600 can be for operating an apparatus, such as an HBM cube (e.g., the set of memory devices 102 of FIG. 1) that is connected to two or more neighboring devices (e.g., GPU of the processor 110 of FIG. 1, and another HBM cube), such as illustrated in FIGS. 2-5 and described above. The apparatus can include a primary HBM cube and a satellite HBM cube(s) that are serially connected to a GPU. The method 600 can be implemented at each of the HBM cubes.

At block 602, the apparatus (e.g., a corresponding HBM cube, such as a primary cube or a satellite cube) can receive a cube assignment to determine which cubes are operating as primary or satellite cubes. The cube assignments can be preset or dynamic, and can indicate if the HBM cubes are operating in a serial and/or a parallel arrangement. In other embodiments, the local logic circuits can be configured to automatically detect its location within a serial and/or a parallel arrangement. In receiving the cube assignment, each HBM cube can identify a predetermined address range that corresponds to the local storage locations.

At block 604, the apparatus receives a command from a GPU and/or an upstream device through a primary IO bus connected to a primary active PHY circuit of the apparatus. The command can include the address that indicates a particular storage location within the apparatus or downstream satellite HBM cube(s) and the corresponding rank from which to read or write data.

At block 606, the apparatus identifies the address of the command. At decision block 607, the apparatus can compare the command address to the predetermined range of locally available addresses. If the address is outside of the predetermined range and indicates a location outside of the predetermined range, at block 608, the apparatus buffers the command. The apparatus can buffer the command at a secondary physical layer circuit prior to transferring the command to a downstream satellite HBM cube. Otherwise, if the address is within the predetermined range and indicates a local storage location, at block 614, the apparatus can access the indicated local storage location (e.g., at one of the local core dies).

As an illustrative example, an HBM can receive a command from a GPU through the primary IO bus in correspondence with block 604. The receiving HBM can compare the address of the received command to see if it indicates a local address or an address that corresponds to another HBM directly connected thereto. Each outgoing/secondary IO bus can have a unique range of associated addresses. The receiving HBM can compare the received address to the predetermined ranges and load the command into the buffer with the matching range in correspondence with blocks 607 and 608. Accordingly, the GPU can be indirectly connected to (i.e., through the receiving HBM) and communicate with other components that are directly connected to the receiving HBM. Thus, based on the HBM serial connection to other HBMs, the GPU can access additional indirectly connected HBMs when the GPU experiences an increased load.

At block 610, the apparatus transfers the buffered command to the downstream satellite HBM cube (e.g., the other HBM in the illustrative example above) through a secondary IO bus connected to an active secondary physical layer circuit of the apparatus. At block 612, the apparatus can receive a response communication, such as read data, command status, error report, or the like, from the downstream satellite HBM cube. The received data can be in response to the command. The communication can include a local command execution result or the received result of the executed command by the downstream satellite HBM cube.

At block 616, the apparatus can provide the communication to the GPU (e.g., the GPU in the illustrative example above) in response to the executed or received command result from the downstream satellite HBM cube. For example, an intermediate satellite HBM can provide the local command execution result or a received result from a downstream HBM cube to an upstream HBM cube. The primary HBM can provide the local command execution result or the result provided by a downstream satellite HBM cube to the processor 110 of FIG. 1.

Figure 6B:
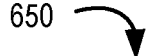
FIG. 6B is a flow diagram illustrating an example method of operating an apparatus in accordance with an embodiment of the present technology.
Figure 6B:
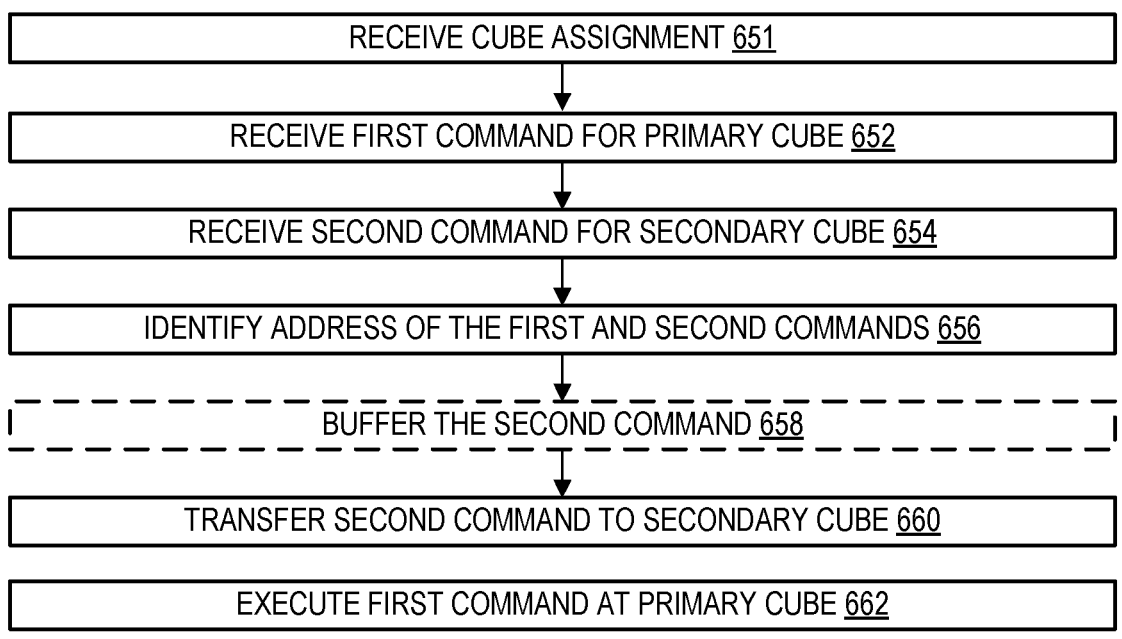

FIG. 6B is a flow diagram illustrating an example method 650 of operating an apparatus (e.g., the apparatus 100 of FIG. 1, memory device 200 of FIG. 2, high bandwidth memory system 300 of FIG. 3, high bandwidth memory system 400 of FIG. 4, high bandwidth memory system 500 of FIG. 5, or a portion thereof) in accordance with an embodiment of the present technology. The method 650 can be for operating an apparatus, such as an HBM cube (e.g., the set of memory devices 102 of FIG. 1) that is connected to two or more neighboring devices (e.g., GPU of the processor 110 of FIG. 1, and another HBM cube), such as illustrated in FIGS. 2-5 and described above. The apparatus can include a primary HBM cube and a secondary HBM cube(s) that are parallelly connected to a GPU.

At block 651, the apparatus (e.g., a corresponding HBM cube, such as the primary cube or the satellite cube) can receive a cube assignment to determine which cubes are operating as primary or secondary cubes. The cube assignments can be preset or dynamic, and can indicate if the HBM cubes are operating in a serial and/or a parallel arrangement. In other embodiments, the local logic circuits can be configured to automatically detect its location within a serial and/or a parallel arrangement. In receiving the cube assignment, each HBM cube can identify a predetermined address range that corresponds to the local storage locations.

At block 652, the apparatus receives a first command from a GPU at a primary HBM cube through a primary IO bus connected to a primary active PHY circuit of the primary HBM cube. The first command can include an address that indicates a particular storage location within the primary HBM cube and the corresponding rank from which to read or write data.

At block 654, the apparatus receives a second command from the GPU at the primary HBM cube through a secondary IO bus connected to a secondary active PHY circuit of the primary HBM cube. The second command can include an address that indicates a particular storage location within the secondary HBM cube.

At block 656, the apparatus identifies the address of the first command is within the primary HBM cube and the address of the second command is within the secondary HBM cube. In response to the address of the second command being within the secondary cube, at block 658, the apparatus buffers the second command (via a physical layer circuit of the primary HBM cube). At block 660, the apparatus transfers the buffered second command to the secondary HBM cube through an IO bus connected to a primary active PHY circuit of the secondary HBM cube. In response to the address of the first command being within the primary HBM cube, at block 662, the apparatus executes the first command in the primary HBM cube.

Figure 7:
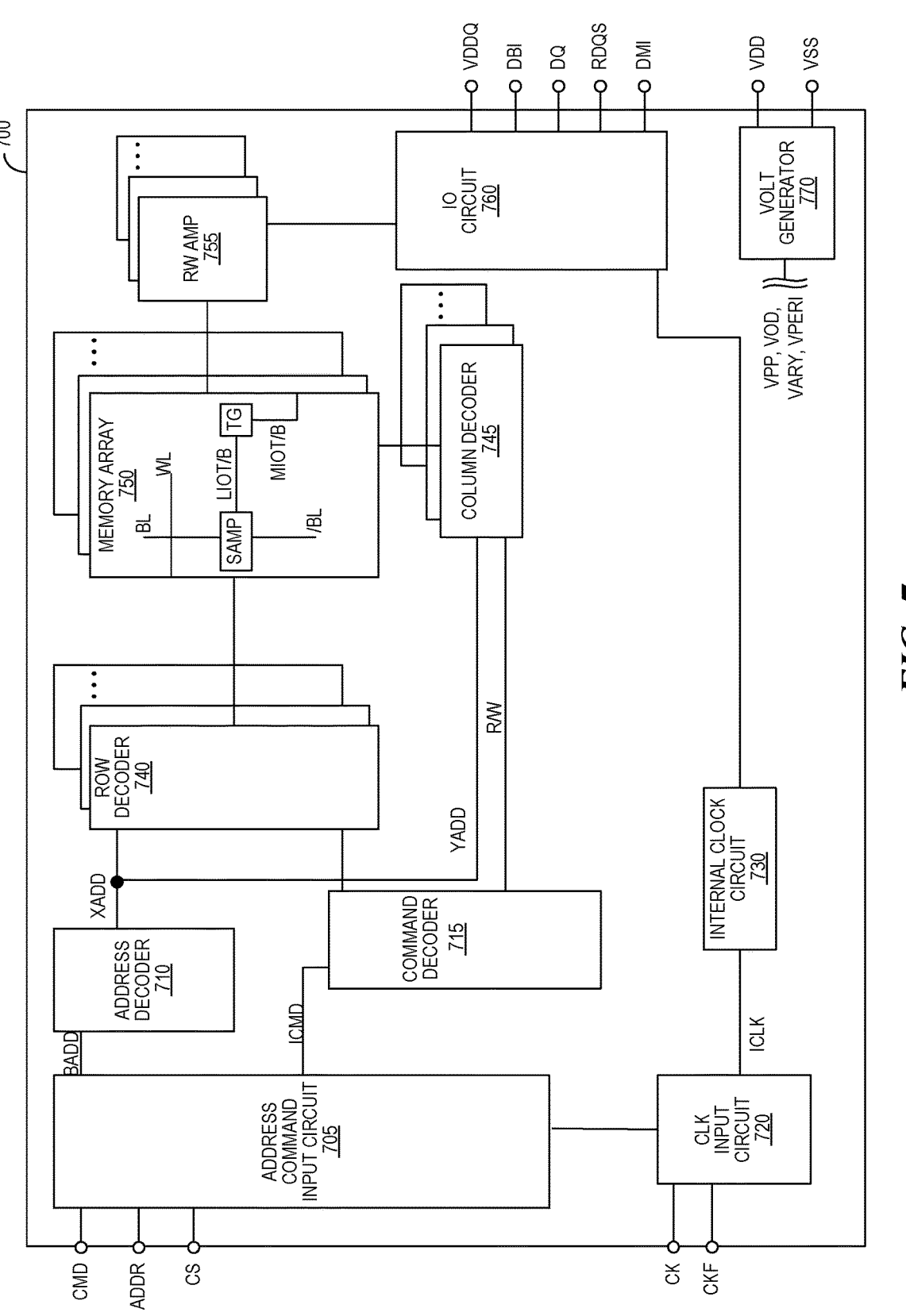
FIG. 7 is a block diagram of an apparatus in accordance with an embodiment of the present technology.

FIG. 7 is a block diagram of an apparatus 700 (e.g., a semiconductor die assembly, including a 3DI device or a die-stacked package, one of the core dies, a portion of an interface die, or a combination thereof) in accordance with an embodiment of the present technology. For example, the apparatus 700 can include a DRAM (e.g., DDR4 DRAM, DDR5 DRAM, LP DRAM, HBM DRAM, etc.), or a portion thereof that includes one or more dies/chips. In some embodiments, the apparatus 700 can include synchronous DRAM (SDRAM) of DDR type integrated on a single semiconductor chip.

The apparatus 700 may include an array of memory cells, such as memory array 750. The memory array 750 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 740, and the selection of a bit line BL may be performed by a column decoder 745. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 750 may also include plate lines and corresponding circuitry for managing their operation.

The apparatus 700 may employ a plurality of external terminals that include command and address terminals coupled to a command bus and an address bus to receive command signals (CMD) and address signals (ADDR), respectively. The apparatus 700 may further include a chip select terminal to receive a chip select signal (CS), clock terminals to receive clock signals CK and CKF, data terminals DQ, RDQS, DBI, and DMI, power supply terminals VDD, VSS, and VDDQ.

The command terminals and address terminals may be supplied with an address signal and a bank address signal (not shown in FIG. 7) from outside. The address signal and the bank address signal supplied to the address terminals can be transferred, via a command/address input circuit 705 (e.g., command circuit), to an address decoder 710. The address decoder 710 can receive the address signals and supply a decoded row address signal (XADD) to the row decoder 740, and a decoded column address signal (YADD) to the column decoder 745. The address decoder 710 can also receive the bank address signal and supply the bank address signal to both the row decoder 740 and the column decoder 745.

The command and address terminals may be supplied with command signals (CMD), address signals (ADDR), and chip select signals (CS), from a memory controller. The command signals may represent various memory commands from the memory controller (e.g., including access commands, which can include read commands and write commands). The chip select signal may be used to select the apparatus 700 to respond to commands and addresses provided to the command and address terminals. When an active chip select signal is provided to the apparatus 700, the commands and addresses can be decoded and memory operations can be performed. The command signals may be provided as internal command signals ICMD to a command decoder 715 via the command/address input circuit 705. The command decoder 715 may include circuits to decode the internal command signals ICMD to generate various internal signals and commands for performing memory operations, for example, a row command signal to select a word line and a column command signal to select a bit line. The command decoder 715 may further include one or more registers for tracking various counts or values (e.g., counts of refresh commands received by the apparatus 700 or self-refresh operations (e.g., a self-refresh entry/exit sequence) performed by the apparatus 700).

Read data can be read from memory cells in the memory array 750 designated by row address (e.g., address provided with an active command) and column address (e.g., address provided with the read). The read command may be received by the command decoder 715, which can provide internal commands to input/output circuit 760 so that read data can be output from the data terminals DQ, RDQS, DBI, and DMI via read/write amplifiers 755 and the input/output circuit 760 according to the RDQS clock signals. The read data may be provided at a time defined by read latency information RL that can be programmed in the apparatus 700, for example, in a mode register (not shown in FIG. 7). The read latency information RL can be defined in terms of clock pulses of the CK clock signal. For example, the read latency information RL can be a number of clock pulses of the CK signal after the read command is received by the apparatus 700 when the associated read data is provided.

Write data can be supplied to the data terminals DQ, DBI, and DMI. The write command may be received by the command decoder 715, which can provide internal commands to the input/output circuit 760 so that the write data can be received by data receivers in the input/output circuit 760 and supplied via the input/output circuit 760 and the read/write amplifiers 755 to the memory array 750. The write data may be written in the memory cell designated by the row address and the column address. The write data may be provided to the data terminals at a time that is defined by write latency WL information. The write latency WL information can be programmed in the apparatus 700, for example, in the mode register (not shown in FIG. 7). The write latency WL information can be defined in terms of clock pulses of the CK clock signal. For example, the write latency information WL can be a number of clock pulses of the CK signal after the write command is received by the apparatus 700 when the associated write data is received.

The power supply terminals may be supplied with power supply potentials VDD and VSS. These power supply potentials VDD and VSS can be supplied to an internal voltage generator circuit 770. The internal voltage generator circuit 770 can generate various internal potentials VPP, VOD, VARY, VPERI, and the like based on the power supply potentials VDD and VSS. The internal potential VPP can be used in the row decoder 740, the internal potentials VOD and VARY can be used in the sense amplifiers included in the memory array 750, and the internal potential VPERI can be used in many other circuit blocks.

The power supply terminal may also be supplied with power supply potential VDDQ. The power supply potential VDDQ can be supplied to the input/output circuit 760 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 760 so that power supply noise generated by the input/output circuit 760 does not propagate to the other circuit blocks.

The clock terminals and data clock terminals may be supplied with external clock signals and complementary external clock signals. The external clock signals CK and CKF can be supplied to a clock input circuit 720 (e.g., external clock circuit). The CK and CKF signals can be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 720 can receive the external clock signals. For example, when enabled by a clock/enable signal from the command decoder 715, an input buffer can receive the clock/enable signals. The clock input circuit 720 can receive the external clock signals to generate internal clock signals ICK. The internal clock signals ICK can be supplied to an internal clock circuit 730. The internal clock circuit 730 can provide various phase and frequency controlled internal clock signals based on the received internal clock signals ICK and a clock enable (not shown in FIG. 7) from the command/address input circuit 705. For example, the internal clock circuit 730 can include a clock path (not shown in FIG. 7) that receives the internal clock signal ICK and provides various clock signals to the command decoder 715. The internal clock circuit 730 can further provide input/output (IO) clock signals. The IO clock signals can be supplied to the input/output circuit 760 and can be used as a timing signal for determining an output timing of read data and the input timing of write data.

The apparatus 700 can be connected to any one of a number of electronic devices capable of utilizing memory for the temporary or persistent storage of information, or a component thereof. For example, a host device of apparatus 700 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 700, although in other embodiments, the host device may be indirectly connected to memory device (e.g., over a networked connection or through intermediary devices).

Figure 8:
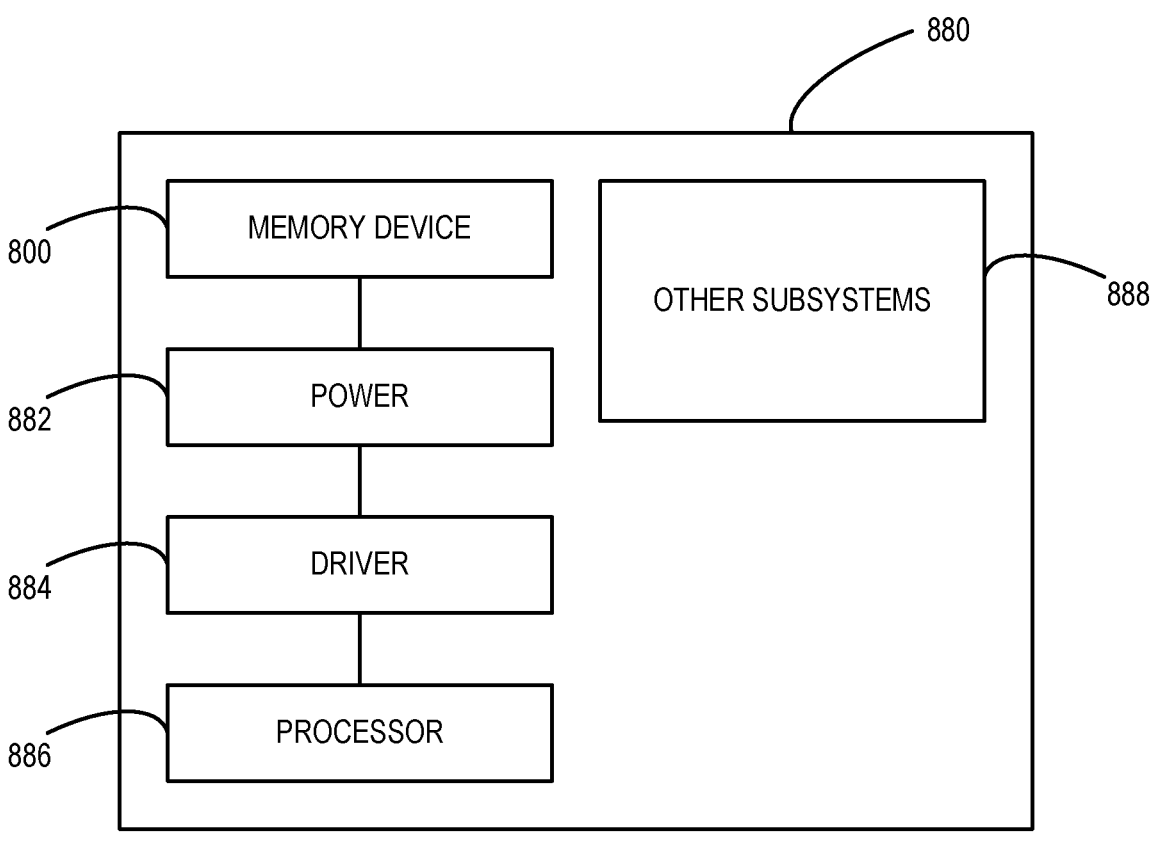
FIG. 8 is a block diagram of a system that includes an apparatus configured in accordance with embodiments of the present technology.

FIG. 8 is a schematic view of a system that includes an apparatus in accordance with embodiments of the present technology. Any one of the foregoing apparatuses (e.g., memory devices) described above with reference to FIGS. 1-7 can be incorporated into or implemented in memory (e.g., a memory device 800) or any of a myriad of larger and/or more complex systems, a representative example of which is system 880 shown schematically in FIG. 8. The system 880 can include the memory device 800, a power source 882, a driver 884, a processor 886, and/or other subsystems or components 888. The memory device 800 can include features generally similar to those of the apparatus described above with reference to FIGS. 1-7 and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-8.

What is claimed is:

1. An apparatus, comprising:
an interposer having at least a first input and output (IO) circuit and a second IO circuit;

a processing unit mounted on the interposer and connected to the first IO circuit;
a first memory cube including first local memory, second local memory, and at least a first physical layer circuit and a secondary communication circuit, the first memory cube mounted on the interposer with the first physical layer circuit connected to the processing unit by the first IO circuit;
a second memory cube mounted on the interposer and connected to the secondary communication circuit of the first memory cube by the second IO circuit, wherein:
the first memory cube is configured to:
receive, from the processing unit, a command through the first IO circuit and the first physical layer circuit;
identify that an address of a storage location identified by the command is in the second memory cube;
buffer the command at the secondary communication circuit; and
transfer the command to the second memory cube through the second IO circuit and the secondary communication circuit.

2. The apparatus of claim 1, wherein the second memory cube is further configured to:
receive, from the first memory cube, the command through the second IO circuit;
identify that the address of the storage location identified by the command is in the second memory cube; and
access the storage location to perform a read operation or a write operation.

3. The apparatus of claim 1, wherein:
the command is a first command,
the first memory cube includes a second physical layer circuit,
the second physical layer circuit is connected to the processing unit by a third IO circuit,
the second physical layer circuit is connected to the second memory cube by a fourth IO circuit, and
the first memory cube is further configured to:
receive, from the processing unit, a second command through the third IO circuit and the second physical layer circuit;
identify that an address of a storage location identified by the second command is in the second memory cube; and
transfer the second command to the second memory cube through the fourth IO circuit and the second physical layer circuit.

4. The apparatus of claim 1, wherein the first memory cube includes:
a set of core dies configured to locally store data; and
an interface die coupled to the set of core dies, the interface die including:
the first physical layer circuit configured to provide a communication interface to the processing unit, and
the secondary communication circuit configured to provide a communication interface to the second memory cube including its own local memory, wherein the secondary communication circuit is configured to (1) implement a serial connection with the second memory cube and the processing unit or (2) complete a connection between the processing unit and the second memory cube that is parallel to a connection between the first physical layer circuit and the processing unit.

5. The apparatus of claim 1, wherein the first memory cube and the second memory cube are connected in series relative to the processing unit.

6. The apparatus of claim 1, wherein the first memory cube and the second memory cube are connected in parallel relative to the processing unit.

7. The apparatus of claim 1, wherein the first physical layer circuit and the secondary communication circuit are connected with one or more through silicon vias.

8. The apparatus of claim 1, wherein:

the first local memory corresponds to a first rank of memory locations accessible to the processing unit; and the second local memory corresponds to a second rank of memory locations accessible to the processing unit.

9. A memory device, comprising:

a physical layer circuit configured to communicate with a first device external to the memory device;

a secondary communication circuit configured to communicate with at least a second device that is external to the memory device;

a logic that is coupled to the physical layer circuit and the secondary communication circuit, wherein the logic is configured to:

receive, from the first device, a command through the physical layer circuit, wherein the command is associated with a storage location;

identify that an address of the storage location is in the second device; and transfer the command to the second device through the secondary communication circuit.

10. The memory device of claim 9, wherein the command is a first command, and wherein the memory device is further configured to:

receive, from the first device, a second command through the secondary communication circuit;

identify that an address of a storage location identified by the second command is in the second device; and transfer the second command to the second device through the secondary communication circuit.

11. The memory device of claim 9, wherein the memory device further comprises:

a set of core dies configured to locally store data; and an interface die coupled to the set of core dies, the interface die including:

the physical layer circuit configured to provide a communication interface to the first device, and the secondary communication circuit is configured to provide a communication interface to the second device including its own local memory, wherein the secondary communication circuit is configured to (1) implement a serial connection with the second device and the first device or (2) complete a connection between the first device and the second device that is parallel to a connection between the physical layer circuit and the first device.

12. The memory device of claim 11, wherein:

the set of core dies include memory cells that are organized into one or more ranks; and identify that the address corresponds to a rank that is different than the one or more ranks corresponding to the memory cells.

13. The memory device of claim 9, wherein the secondary communication circuit includes a buffer configured to temporarily buffer the command before transferring the command to the second device.

14. A method of operating an apparatus, the method comprising:

receiving, by first physical layer circuit on a first memory cube, a command that is from a processing unit and communicated through a first input and output (IO) circuit on an interposer, wherein the first memory cube and the processing unit are mounted on the interposer;

identifying, at the first memory cube, that an address of a storage location identified by the command is in a second memory cube;

buffering the command at a secondary communication circuit within the first memory cube; and transferring the command to the second memory cube through a second IO circuit on the interposer and the secondary communication circuit.

15. The method of claim 14, wherein:

the command is a first command, the first memory cube includes a second physical layer circuit, the second physical layer circuit is connected to the processing unit by a third IO circuit, the second physical layer circuit is connected to the second memory cube by a fourth IO circuit, and the method further comprising:

receiving, from the processing unit, a second command through the third IO circuit and the second physical layer circuit;

identifying that an address of a storage location identified by the second command is in the second memory cube; and transferring the second command to the second memory cube through the fourth IO circuit and the second physical layer circuit.

16. The method of claim 14, wherein the command is a first command, the method further comprising:

receiving a second command from the processing unit and the first IO circuit; and determining that the second command is associated with a memory location within a set of core dies within the first memory cube and configured to locally store data.

17. The method of claim 14, wherein:

receiving the command includes operating the first physical layer circuit on an interface die within the first memory cube to provide a communication interface to the processing unit, and buffering and transferring the command includes operating the secondary communication circuit to provide a communication interface to the second memory cube based on (1) implementing a serial connection with the second memory cube and the processing unit or (2) completing a connection between the processing unit and the second memory cube that is parallel to a connection between the first physical layer circuit and the processing unit.

18. The method of claim 14, wherein the first memory cube and the second memory cube are serially connected to the processing unit.

19. The method of claim 14, wherein the first memory cube and the second memory cube are parallelly connected to the processing unit.

20. The method of claim 14, wherein the first physical layer circuit and the secondary communication circuit are connected with one or more through silicon vias.

\* \* \* \* \*